(12) United States Patent
Jacobson et al.

(10) Patent No.: US 7,100,144 B2
(45) Date of Patent: Aug. 29, 2006

(54) SYSTEM AND METHOD FOR TOPOLOGY SELECTION TO MINIMIZE LEAKAGE POWER DURING SYNTHESIS

(75) Inventors: Hans M. Jacobson, White Plains, NY (US); Prabhakar N. Kudva, New York, NY (US); Leon J. Sigal, Monsey, NY (US)

(73) Assignee: International Business Machines Corporation, Armonk, NY (US)

( * ) Notice: Subject to any disclaimer, the term of this patent is extended or adjusted under 35 U.S.C. 154(b) by 222 days.

(21) Appl. No.: 10/731,840

(22) Filed: Dec. 9, 2003

(65) Prior Publication Data

US 2005/0125761 A1 Jun. 9, 2005

(51) Int. Cl.
*G06F 17/50* (2006.01)
(52) U.S. Cl. ............... 716/18; 716/2; 716/3; 716/4; 716/5
(58) Field of Classification Search ............... 716/1–5, 716/18
See application file for complete search history.

(56) References Cited

U.S. PATENT DOCUMENTS

| 6,345,379 B1 * | 2/2002 | Khouja et al. ............... 716/4 |
| 2002/0144223 A1 * | 10/2002 | Usami et al. ............... 716/4 |
| 2003/0126579 A1 * | 7/2003 | Whitaker et al. ............ 716/18 |
| 2005/0044515 A1 * | 2/2005 | Acar et al. .................. 716/5 |

* cited by examiner

*Primary Examiner*—Paul Dinh
(74) *Attorney, Agent, or Firm*—F. Chau & Associates LLC

(57) ABSTRACT

A system for topology selection to minimize leakage power during synthesis, wherein the system is configured to receive a circuit model that has one or more circuit gates. The system is further configured to receive a library having one or more logic gates, wherein each logic gate has a topology and the leakage sensitivities for each of the topologies is calculated. The system is then configured to synthesize a new circuit model by selecting one or more of the topologies based on its leakage sensitivities, wherein the new circuit model has reduced current leakage.

34 Claims, 7 Drawing Sheets

200

| TYPE 210 | Gds 220 | Leak/μm 230 |
|---|---|---|
| P-gate | 011 | 1.54 |
| P-gate | 101 | 0.11 |
| P-gate | 110 | 0.11 |
| P-gate | 100 | 0.24 |
| P-gate | 10L | 0.20 |
| P-gate | 1L0 | 0.20 |
| P-gate | 1LL | 0.15 |
| P-gate | 1L1 | 0.10 |
| P-gate | 11L | 0.10 |
| P-gate | 111 | 0.00 |
| P-srcdrn | 101 | 4.59 |
| P-srcdrn | 110 | 4.59 |
| P-srcdrn | 1L1 | 2.77 |
| P-srcdrn | 11L | 2.77 |
| P-srcdrn | 111 | 0.00 |
| P-srcdrn | 0L0 | 0.00 |
| P-srcdrn | 00L | 0.00 |
| P-srcdrn | 0LL | 0.00 |
| P-srcdrn | 011 | 0.00 |
| N-gate | 001 | 0.11 |
| N-gate | 010 | 0.11 |
| N-gate | 011 | 0.24 |
| N-gate | 100 | 1.54 |
| N-gate | 00H | 0.10 |
| N-gate | 0H0 | 0.10 |
| N-gate | 01H | 0.20 |
| N-gate | 0H1 | 0.20 |
| N-gate | 0HH | 0.15 |
| N-gate | 11H | 0.00 |
| N-gate | 1H1 | 0.00 |
| N-gate | 1HH | 0.00 |
| N-srcdrn | 001 | 2.68 |
| N-srcdrn | 010 | 2.68 |
| N-srcdrn | 00H | 1.06 |
| N-srcdrn | 0H0 | 1.06 |
| N-srcdrn | 100 | 0.00 |
| N-srcdrn | 1H1 | 0.00 |
| N-srcdrn | 11H | 0.00 |

FIG. 2

| Topology 510 | pfet 520 | nfet 530 |
|---|---|---|
| inverter | 3.12 | 2.16 |
| nand2 | 1.94 | 1.09 |
| nand3 | 1.36 | 0.68 |
| nand4 | 1.06 | 0.48 |
| nor2 | 1.54 | 1.47 |
| nor3 | 0.90 | 1.12 |
| aoi21 | 1.29 | 1.15 |
| oai21 | 1.49 | 0.92 |
| aoi22 | 1.39 | 1.05 |
| oai22 | 1.35 | 1.06 |
| xor2 | 1.62 | 1.26 |
| xnor2 | 1.90 | 1.16 |

| Macro 610 | AREA 620 | Leak 630 | Area 640 | Slack 650 |
|---|---|---|---|---|
| idcdsuc | 6265 | -4.94 | -0.79 | 1ps |
| ioexcpt | 6488 | -4.77 | 2.74 | 0ps |
| idagilk | 12967 | -12.49 | -2.45 | -4ps |
| ifctl2 | 29552 | -5.30 | 0.51 | 26ps |
| ifctl1 | 29873 | -2.21 | 1.11 | 3ps |
| idecode | 67878 | -4.29 | 0.78 | -16ps |

SYSTEM AND METHOD FOR TOPOLOGY SELECTION TO MINIMIZE LEAKAGE POWER DURING SYNTHESIS

BACKGROUND OF THE INVENTION

1. Technical Field

The present invention relates to electronic circuit design and more particularly, to topology selection of logic gates during synthesis of electronic circuits for minimizing leakage power.

2. Discussion of the Related Art

Static power dissipation is becoming a major design constraint, not only in portable, but also in high performance very large-scale integrated (VLSI) systems. As static power dissipation exceeds dynamic power dissipation in high performance designs, synthesis techniques are being adapted to reduce leakage currents.

Several techniques have been proposed to achieve leakage power reduction based on circuit-level optimization techniques. These techniques require architectural support, and in some cases, technology support, and are applied at run-time (i.e., dynamically) and can be divided into three different categories: (1) input vector control; (2) threshold variation; and (3) power supply gating.

In one example of an input vector control technique, designers introduce sleep transistors to mitigate the increase in leakage current when low-threshold devices are inserted into a design. In this technique, the power and supply terminals of low threshold voltage gates are surrounded by high threshold positive-channel metal oxide semiconductor (PMOS) and negative-channel metal oxide semiconductor (NMOS) transistors, which are normally on in an active mode. In the sleep mode, the high threshold sleep transistors are turned off, thereby limiting the leakage of the high threshold transistors. This technique has a few disadvantages; however, such as decreased circuit speed due to the sleep transistor's resistance and increased area requirements for sleep signals and sleep transistors in a circuit design.

In an example of a threshold variation technique, high threshold devices are placed on non-critical paths and low threshold devices are placed on critical ones. In another threshold variation technique, the body and gate of each transistor are tied together such that whenever the device is off, low leakage is achieved while when the device is on, higher current drives are possible.

In another technique, known as power supply gating, the power supply is shut down so that idle components do not consume leakage power. This can be done by using multi-threshold complementary metal oxide semiconductor (MTCMOS) sleep transistors. The problems associated with this technique are reduced performance and noise immunity if care is not exercised when designing the sleep transistors.

The techniques discussed above attempt to reduce power leakage by performing leakage optimization on components' threshold voltages and/or components' oxide thicknesses. None of these techniques, however, take advantage of the fact that different gate topologies have different gate sensitivities for a unit width of a transistor size to its leakage current as an approach to topology selection.

SUMMARY OF THE INVENTION

The present invention overcomes the foregoing and other problems encountered in the known teachings by providing a system and method for topology selection to minimize leakage power during synthesis. Advantageously, the system and method minimizes static power dissipation by taking advantage of the distinct leakage characteristics of different gate topologies. The system and method also develops a static leakage model that characterizes the leakage sensitivities of different gate topologies in a common semiconductor and/or standard cell library. The system and method then applies this model during technology independent synthesis and/or technology dependent and physical synthesis to create an electronic circuit that has a minimized leakage power.

The system and method additionally uses a traditional logic synthesis such as technology mapping, kernel factoring, logic decomposition and buffering that is modified to take into account the static leakage models. The algorithms treat static leakage based on topology as an additional cost metric during optimization.

In one embodiment of the present invention, a system for designing electronic circuits comprises a memory device for storing a program, a processor in communication with the memory device, the processor operative with the program to receive a circuit model, wherein the circuit model has one or more circuit gates, receive a library having one or more logic gates, wherein each logic gate has a topology, calculate leakage sensitivities for each of the topologies, and synthesize a new circuit model by selecting one or more of the topologies based on its leakage sensitivities, wherein the new circuit model has reduced current leakage.

In another embodiment of the present invention, a method for designing electronic circuits comprises receiving a circuit model, wherein the circuit model has one or more circuit gates, receiving a library having one or more logic gates, wherein each logic gate has a topology, calculating leakage sensitivities for each of the topologies, and synthesizing a new circuit model by selecting one or more of the topologies based on its leakage sensitivities, wherein the new circuit model has reduced current leakage.

In yet another embodiment of the present invention, a computer program product comprising a computer useable medium having computer program logic recorded thereon for designing electronic circuits, the computer program logic comprises program code for receiving a circuit model, wherein the circuit model has one or more circuit gates, program code for receiving a library having one or more logic gates, wherein each logic gate has a topology, program code for calculating leakage sensitivities for each of the topologies, and program code for synthesizing a new circuit model by selecting one or more of the topologies based on its leakage sensitivities, wherein the new circuit model has reduced current leakage.

In another embodiment of the present invention, a system for designing electronic circuits for reducing leakage power comprises an input for inputting a circuit design, wherein the circuit design is input using a hardware description language (HDL) that is capable of providing leakage sensitivities to a cell library, a compiler for compiling the HDL into machine readable language, a technology independent optimizer for performing technology independent optimization of the circuit design, a technology mapper for generating a hardware unit to be associated with the circuit design after the circuit design is processed through the technology independent optimizer, a leakage optimizer for optimizing a leakage current of the hardware unit by applying a set of leakage sensitivities in the cell library to the hardware unit, a physical circuit generator for generating a new circuit design according to the hardware unit optimized by the leakage optimizer and an output for outputting the new circuit design.

In yet another embodiment of the present invention, a system for topology selection to minimize leakage power during synthesis comprises a memory device for storing a program, a processor in communication with the memory device, the processor operative with the program to receive a circuit design and synthesize a new circuit design having a minimized leakage power, wherein the power of the new circuit is minimized by applying an area or timing optimization algorithm that incorporates leakage sensitivities of device topologies.

The foregoing advantages and features are of representative embodiments and are presented to assist in understanding the invention. It should be understood that they are not intended to be considered limitations on the invention as defined by the claims, or limitations on equivalents to the claims. Therefore, this summary of features and advantages should not be considered dispositive in determining equivalents. Additional features and advantages of the invention will become apparent in the following description, from the drawings and from the claims.

BRIEF DESCRIPTION OF THE DRAWINGS

FIG. 2 illustrates an exemplary table listing of the normalized leakage of a field effect transistor (FET);

FIG. 5 illustrates an exemplary table listing of the average leakage for several gate topologies calculated in accordance with the present invention;

FIG. 6 illustrates an exemplary table listing the characteristics of a microprocessor after it was synthesized in accordance with the present invention.

DETAILED DESCRIPTION OF EXEMPLARY EMBODIMENTS

Figure 1:
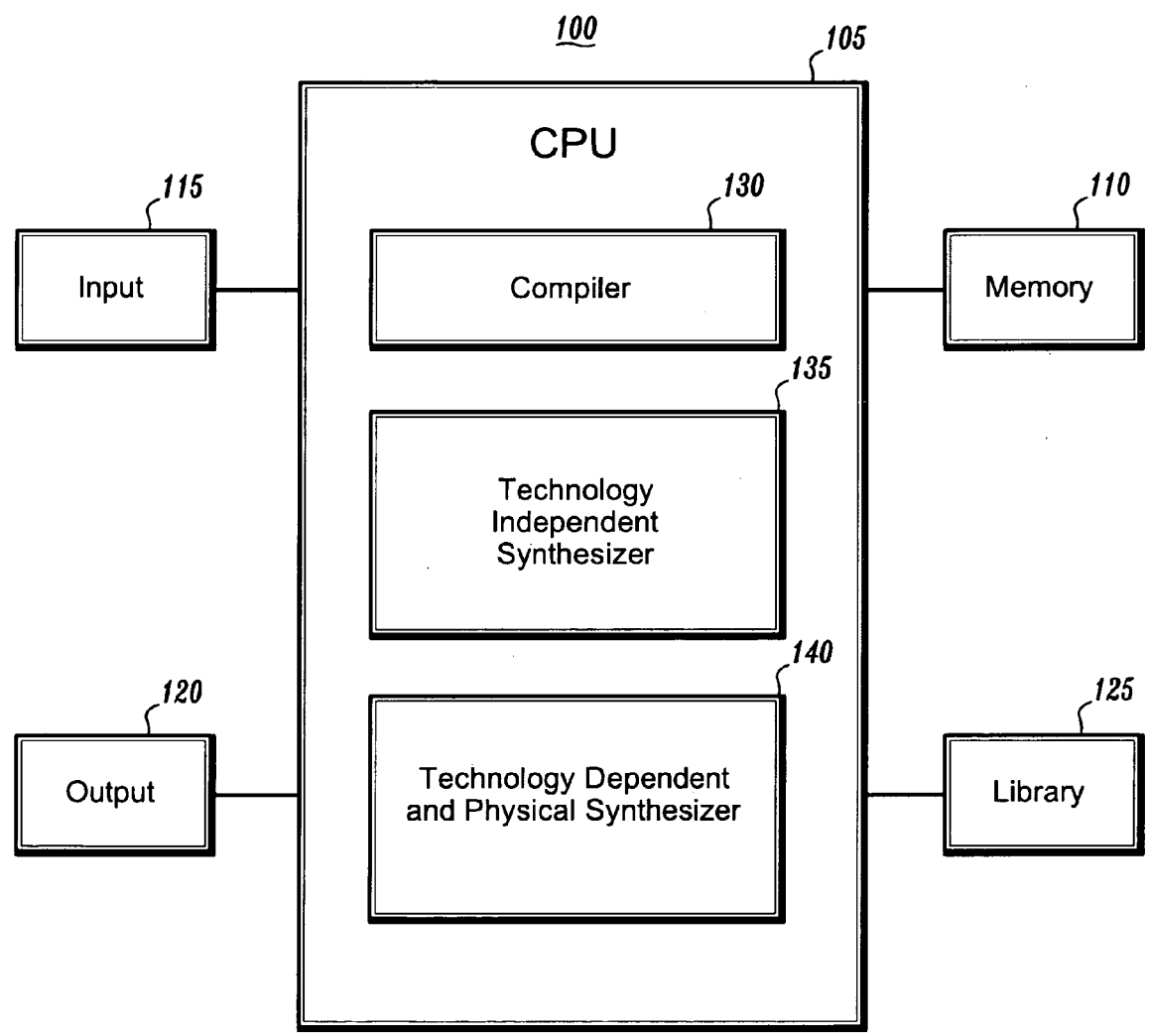
FIG. 1 illustrates an exemplary electronic circuit design system in accordance with the present invention.

FIG. 1 illustrates an exemplary electronic circuit design system in accordance with the present invention. As shown in FIG. 1, an electronic circuit design system 100 includes, inter alia, a central processing unit (CPU) 105, a memory 110, an input 115, an output 120 and a library 125. The CPU 105 includes a compiler 130, a technology independent synthesizer 135 and a technology dependent and physical synthesizer 140.

The compiler 130 has a function of compiling a High-level Design Language (HDL), where the HDL represents, for example, a design entered into the system by a user, into a logical network composed of logical blocks including equation blocks, functional blocks such as adders and multiplexers, and gates. The logical network is stored in the memory 110.

The technology independent synthesizer 135 has a function of performing technology independent optimization of the logical network. Here, the optimization does not initially consider concrete hardware configurations of the logical blocks. Rather, the technology independent synthesizer 135 applies optimization methods to optimize the timing and area of the logical network. The technology independent synthesizer 135 additionally applies an optimization method to optimize current leakage of the logic network and will be discussed in detail hereinafter in connection with FIGS. 2–6. This information is stored in the memory 110.

The technology dependent and physical synthesizer 140 generates a hardware network by assigning a matching hardware unit to the logical blocks of the logical network. The hardware network is then stored in the memory 110 and additional timing, area and current leakage optimizations are performed on the hardware network. Finally, the technology dependent and physical synthesizer 140 generates a new electronic circuit design to be output via the output 120.

The memory 110 can include random access memory (RAM), read only memory (ROM), disk drive, tape drive, etc., or a combination thereof. The ROM functions as a program memory for storing a program executed in the CPU 105. The RAM functions as a data memory that stores data used during the execution of the program in the CPU 105 and is used as a work area. The input 115 is constituted by a keyboard, mouse, etc. A user, for example, may specify information about a state of a logic circuit whose leakage current he seeks reduced to the CPU 105 via the input 115. The output 120 is constituted by a liquid crystal display, a cathode ray tube (CRT) display, a printer, etc.

The library 125 is, for example, a database that includes data associated with a number of logic gates such as and, or, inverter, nand2, nand4, nor2, nor3, xor2, etc. that is used by the technology independent synthesizer 135 and the technology dependent and physical synthesizer 140. The library 125 also includes leakage characteristics for the logic gates therein. The library 125 may also receive leakage characteristics from the input 115 that are not already in the library 125.

The leakage characteristics provided to the library 125 are developed according to a topology dependent leakage model, discussed infra.

Topology Dependent Leakage Model

The technology dependent leakage model is based on the assumption that the leakage of a static complementary metal oxide semiconductor (CMOS) gate varies as a function of the topology of its transistors and the leakage of a CMOS field effect transistor (FET) device depends on the logic state of its gate, drain and source terminals. Thus, allowing the average leakage of a gate to be expressed as the sum of the state dependent leakage of all its FET devices for all logic states through the application of all value combinations at the primary inputs of the gate. By using computed average leakages of gates, this model can identify the current leakage characteristics of different gate topologies.

1. FET State Dependent Leakage

The leakage of a FET device can be categorized for the set of logic values that, in static CMOS gates, are attainable and allowable on the device terminals. FIG. 2 illustrates an exemplary table 200 listing the normalized leakage of a FET for several states. As shown in FIG. 2, the table 200 includes columns TYPE 210, gds 220 and leak/µm 230. TYPE 210 lists the gate and source-drains of a FET. Gds 220 lists the input values associated with the gate, drain and source terminals of a FET. Leak/µm 230 lists the leakage values in µa of the gate types in TYPE 210 for the input values in column gds 220.

For example, the P-gate in the first row of TYPE 210 has an input of "011" applied thereto as shown in the first row of gds 220. The input "011" indicates that a logic 0 is input to the gate, a logic 1 is input to the source and a logic 1 is input to the drain of the P-gate. The resulting gate leakage for this configuration is 1.54 µA as shown in the first row of column leak/μm 230. As shown in FIG. 2, H (in gds 220) stands for VDD (i.e., power to the circuit)-Vth (i.e., threshold voltage) (weak 1) while L (in gds 220) stands for VDD-Vtl (weak 0). FIG. 2 does not illustrate gate leakage for weak logic values.

The leakage through a FET device from one terminal to another is typically very small when one of the terminals is at a high impedance (Z). This is observed, for example, in source to drain leakage through two series connected devices when both devices are turned off. In this situation, the middle source and drain terminals connecting the two devices are both at high impedance. Similarly, gate leakage through two series connected devices is very small when the node connecting the source and drain terminals is at high impedance. As a result, this leakage is very small relative to the leakage at non-high impedance nodes. Leakage at high impedance nodes is treated as close to zero and not illustrated in FIG. 2.

Leakage values at high impedance nodes can be obtained, however, through the table 200 illustrated in FIG. 2 using the following procedure. A high impedance node in the context of gate leakage is set to the same value as the gate node when performing a table lookup. Similarly, a high impedance node in the context of source to drain leakage is set to the same value as the source or drain node when performing a table lookup. If both source and drain nodes are high impedance, they are both set to the gate node value when performing a table lookup. A table lookup that does not match any table entry returns a zero value as the states not illustrated in FIG. 2 have leakage close to zero.

Note that a complete set of entries is not given for the table in FIG. 2 as it is simplified for illustration purposes. The present invention further includes table entries for additional leakage states and additional sources of leakage present in logic devices. In addition to what is illustrated in the table of FIG. 2, the present invention further includes, but is not limited to, table entries based on: (1) leakage states for all possible combinations of 0, 1, H, L and Z values for all terminals of a device, (2) all possible terminals of a device including, but not limited to, gate, source, drain and body terminals, and (3) all possible sources of leakage current including, but not limited to, gate to source leakage, gate to drain leakage, gate to substrate leakage, source to drain leakage, source to substrate leakage and drain to substrate leakage.

2. Gate Topology Dependent Leakage

The leakage of a gate can be determined by applying the leakage values illustrated in FIG. 2 to the FET devices in the gate for each logic state of its input signal vector. The leakage of one gate type can be directly related to the leakage of another gate type. This is done by first sizing the gates to be compared such that the sum of their positive-channel (PFET) and negative-channel (NFET) widths, respectively, are the same. The sum of the FET leakages for all possible input states is then normalized with respect to the number of input states of the gate.

For example, consider comparing the average leakage of an inverter with that of a two input nand gate. Each device in the nand gate could be sized to 1 μm and each device in the inverter sized to 2 μm. The inverter leakage is derived from its two input states a=0 and a=1. For a given input state, the leakage is obtained by observing the states of the FETs and looking up the corresponding leakage values in FIG. 2.

Figure 3:
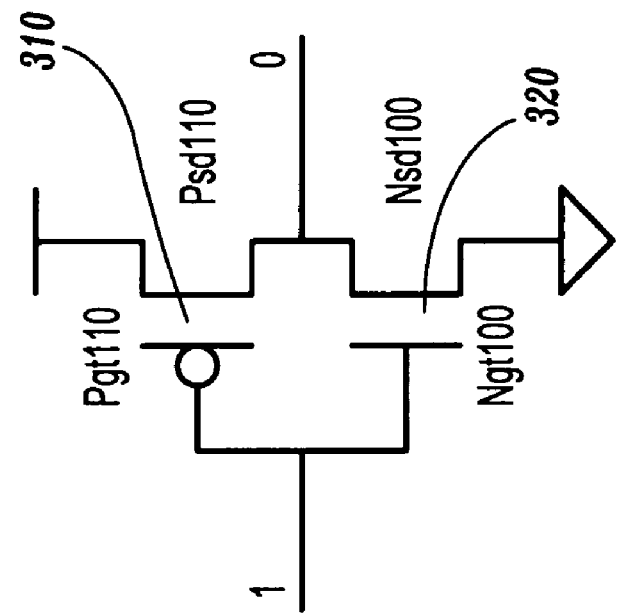
FIG. 3 illustrates exemplary leakage components of an inverter.
Figure 3:
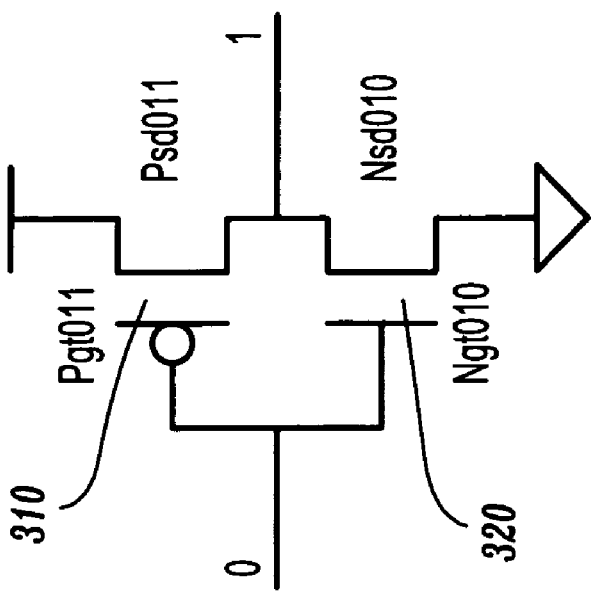

FIG. 3 illustrates exemplary leakage components of an inverter 300. As shown in FIG. 3, an inverter 300 having a logic 0 input and a logic 1 output includes the leakage components Pgt011, Ngt010, Psd011 and Nsd010 and the inverter 300 having a logic 1 input and a logic 0 output includes the leakage components Pgt110, Ng100, Psd110 and Nsd100. The leakage components Pgt011, Ngt010, Psd011 and Nsd010 represent the leakages of the gate of a P-transistor 310, gate of an N-transistor 320, source-drain of the P-transistor 310 and source-drain of the N-transistor 320 when a logic 0 is input. The leakage components Pgt110, Ng100, Psd110 and Nsd100 represent the leakages of the gate of a P-transistor 310, gate of an N-transistor 320, source-drain of the P-transistor 310 and source-drain of the N-transistor 320 when a logic 1 is input.

As shown in FIG. 3, when a logic 0 is input the entries (P-gate, 011), (N-gate, 010), (P-srcdrn, 011) and (N-srcdrn, 010) of FIG. 2 apply to Pgt011, Ngt010, Psd011 and Nsd010, respectively. When a logic 1 is input the entries (P-gate, 110), (N-gate, 100), (P-srcdrn, 110) and (N-srcdrn, 100) of FIG. 2 apply to Pgt110, Ngt100, Psd110 and Nsd100, respectively. These entries are multiplied with the respective FET width and summed up. The resulting sum is then divided by the number of input states to provide a state dependent leakage measure. The leakage of an inverter with P and N widths set to 2 times the minimum device length is given by the following equation.

$$INV_{leak} = P_{gt011} + N_{gt010} + P_{sd011} + N_{sd010} + P_{gt110} + N_{gt100} + P_{sd110} + N_{sd100} \quad (1)$$

Thus, by multiplying each inverter gate leakage by 2 summing them together as shown by equation (1) and dividing the result by 2 the average leakage current value for all input patterns of the inverter is 10.57 μA.

Figure 4:
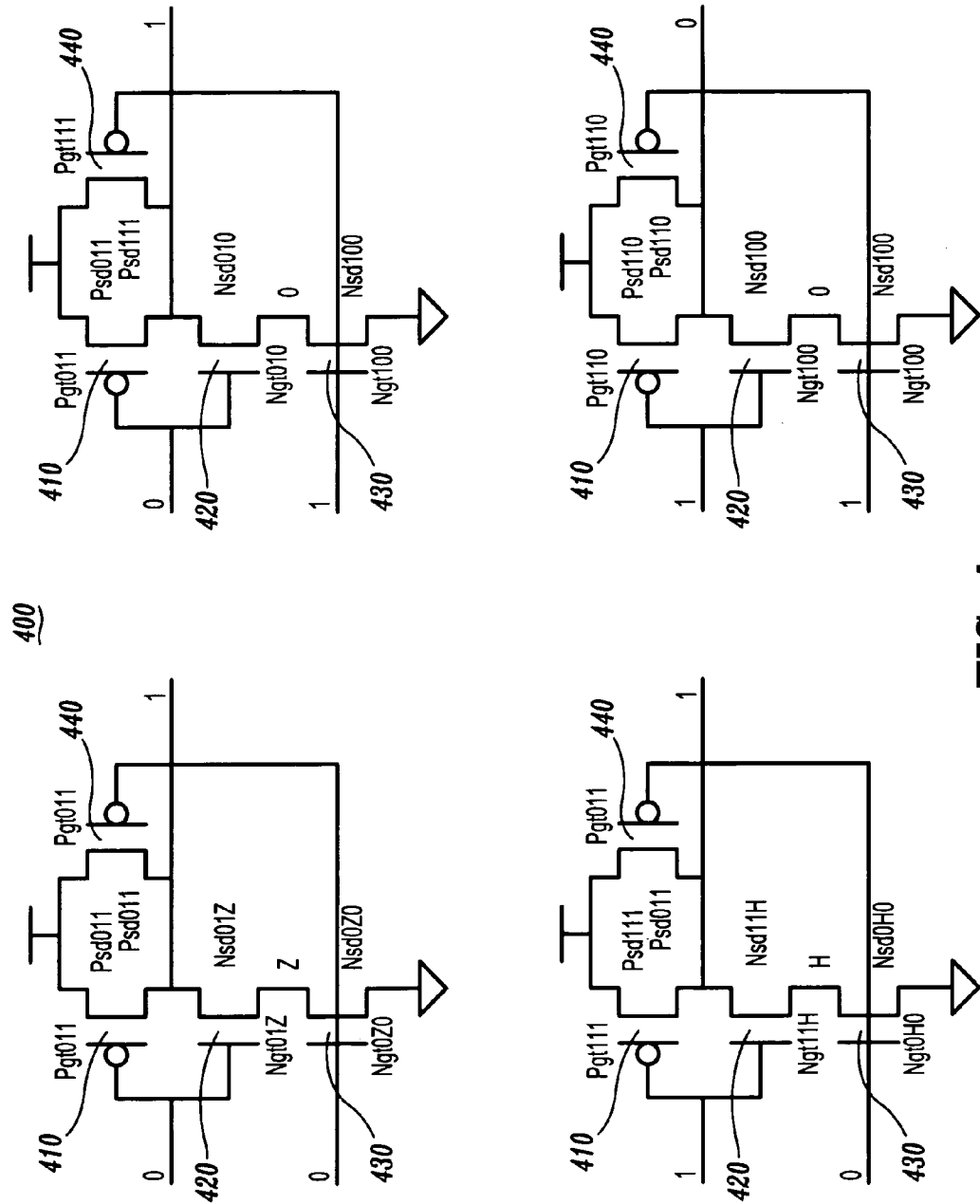
FIG. 4 illustrates exemplary leakage components of a nand gate.

Unlike the inverter shown in FIG. 3, a nand gate requires additional considerations as some of its internal nodes may be at high impedance during certain input conditions. FIG. 4 illustrates exemplary leakage components of a nand gate 400. As shown in FIG. 4, a nand gate 400 having: (1) a logic 0, 0 input and a logic 1 output includes the leakage components Pgt011, Psd011, Pgt011, Psd011, Ngt01Z, Nsd01Z, Ngt0Z0 and Nsd0Z0, (2) a logic 0, 1 input and a logic 1 output includes the leakage components Pgt011, Psd011, Pgt111, Psd111, Ngt010, Nsd010, Ngt100 and Nsd100, (3) a logic 1, 0 input and a logic 1 output includes the leakage components Pgt111, Psd111, Pgt011, Psd011, Ngt11H, Nsd11H, Ngt0H0 and Nsd0H0, and (4) a logic 1, 1 input and a logic 0 output includes the leakage components Pgt110, Psd110, Pgt110, Psd110, Ngt100, Nsd100, Ngt100 and Nsd100.

As shown in FIG. 4, the leakage components Pgt011, Psd011 represent the leakages of the gate and source-drain of a P-transistor 410, leakage components Nsd01Z, Ngt01Z represent the leakages of the source-drain and gate of an N-transistor 420, leakage components Nsd0Z0, Ngt0Z0 represent the leakages of the source-drain and gate of an N-transistor 430, and leakage components Pgt011, Psd011 represent the leakages of the gate and source-drain of a P-transistor 440 when a logic 0, 0 is input. The leakage components Pgt011, Psd011 represent the leakages of the gate and source-drain of the P-transistor 410, leakage components Nsd010, Ngt010 represent the leakages of the source-drain and gate of the N-transistor 420, leakage components Nsd100, Ngt100 represent the leakages of the source-drain and gate of the N-transistor 430, and leakage components Pgt111, Psd111 represent the leakages of the gate and source-drain of the P-transistor 440, when a logic 0, 1 is input. The leakage components Pgt111, Psd111 represent the leakages of the gate and source-drain of the P-transistor 410, leakage components Nsd11H, Ngt11H represent the leakages of the source-drain and gate of the N-transistor 420, leakage components Nsd0H0, Ngt0H0 represent the leakages of the source-drain and gate of the N-transistor 430, and leakage components Pgt011, Psd011 represent the leakages of the gate and source-drain of the P-transistor 440, when a logic 1, 0 is input. The leakage components Pgt110, Psd110 represent the leakages of the gate and source-drain of the P-transistor 410, leakage components Nsd100, Ngt100 represent the leakages of the source-drain and gate of the N-transistor 420, leakage components Nsd100, Ngt100 represent the leakages of the source-drain and gate of the N-transistor 430, and leakage components Pgt110, Psd110 represent the leakages of the gate and source-drain of the P-transistor 440, when a logic 1, 1 is input.

As shown in FIG. 4, high impedance nodes are translated to values before performing a table lookup as explained above for FET State Dependent Leakage. Lookups with no matching entry represent a zero leakage value. With the above assumptions regarding high impedance nodes, the leakage of a two input nand gate with the FET devices all set to minimum width is given by the following equations, with high impedance components denoted by a Z.

$$NAND2_{gt} = P1_{gt011} + P2_{gt011} + N1_{gt01Z} + N2_{gt0Z0} + P1_{gt011} + P2_{gt111} + N1_{gt010} + N2_{gt100} + P1_{gt111} + P2_{gt011} + N1_{gt11H} + N2_{gt0H0} + P1_{gt110} + P2_{gt110} + N1_{gt100} + N2_{gt100} \quad (2)$$

$$NAND2_{gt} = P1_{sd011} + P2_{sd011} + N1_{sd01Z} + N2_{sd0Z0} + P1_{sd011} + P2_{sd111} + N1_{sd010} + N2_{sd100} + P1_{sd111} + P2_{sd011} + N1_{sd11H} + N2_{sd0H0} + P1_{sd110} + P2_{sd110} + N1_{sd100} + N2_{sd100} \quad (3)$$

$$NAND2_{gt} = (NAND2_{gt} + NAND2_{sd})/4 \quad (4)$$

Thus, by performing a table lookup (i.e., looking up the corresponding gate values in table 200) and inserting those values into equations (2) and (3) and then plugging those values into equation (4) the average leakage current value for all input patterns of the nand gate is 6.06 μA. As such, the relative average case leakage of an inverter as compared to a two input nand gate is 10.57/6.06=1.74. As illustrated, for an equivalent sum of pfet widths and nfet widths, an inverter leaks about 1.7 times more current than a two input nand due to its topology.

FIG. 5 illustrates an exemplary table 500 listing the average leakage for several gate topologies calculated in accordance with the present invention. As shown in FIG. 5, the table 500 includes columns Topology 510, pfet 520 and nfet 530. Topology 510 lists a dozen gates whose average leakage characteristics have been calculated in accordance with the topology dependent leakage model. Pfet 520 lists the average values of the current leakage per unit transistor width for the P-transistors of the gates listed in Topology 510. Nfet 530 lists the average values of the current leakage per unit transistor width for the N-transistor of the gates listed in Topology 510.

These leakage values can be input into an existing semiconductor and/or cell library or into a design via a HDL and combined with an existing synthesis algorithm such as a technology mapping algorithm that takes area and/or timing into account, and used to minimize the current leakage of a circuit. In order to minimize the current leakage in a circuit, an existing synthesis algorithm's function is changed from, for example, area reduction to leakage reduction.

For example, a typical technology mapping algorithm optimizes the design for either delay, area or some combination of both. This algorithm traverses each cone of logic from an output to input by selecting topologies for the logic encountered such that the topologies are optimal for delay at the output. The topologies of the logic gates that do not directly affect the output delay (e.g., non-critical logic) are selected for optimal delay as well. In accordance with the present invention, the modified technology mapping algorithm performs a similar procedure; however, during traversal from the output to input, the algorithm verifies if a given signal is critical to the delay at the output. If the signal is critical, it performs a typical topology selection for delay. If the signal is not critical, it selects a topology that is optimal for leakage power. In order to pick a topology optimal for static leakage, it uses the models provided (e.g., the calculated topology dependent leakage model) to estimate the topology based static leakage for all possible topologies that might replace the logic encountered during traversal. The algorithm then selects the optimal topology such that the leakage is optimal, while precluding the delay from becoming critical at that node. Therefore, static leakage is used as an additional objective function cost optimized by the algorithm along with other objectives such as time and area. It is to be understood that an extension of this algorithm can perform leakage optimizations on critical paths where leakage can be reduced at the cost of increased delay.

In an alternative variant of the present invention, the average case leakage of the nand2 and inverter gates can be obtained through an actual simulation of the logic gate with a circuit simulator for all possible input patterns to the logic gate. The leakage values obtained via simulation are then averaged over all possible input patterns to obtain the average leakage value. As a result, the leakage values for the logic gates can be obtained either by using equations (e.g., equations 1–4) and the data shown in FIG. 5 or by simulating each logic gate with a number of input patterns in a circuit simulator and measuring leakage current as given by the simulator. The first method of obtaining average leakage current may be referred to as analytical and the second method may be referred to as empirical.

FIG. 6 illustrates an exemplary table 600 listing the characteristics of a microprocessor after it was synthesized in accordance with the present invention. As shown in FIG. 6, the table 600 includes columns Macro 610, AREA 620, leak 630, area 640 and slack 650. Macro 610 lists the logic macros of the microprocessor to which the leakage model of the present invention coupled with a common optimization algorithm was applied. As described for the technology mapping algorithm of FIG. 5, other logic synthesis and physical synthesis algorithms such as buffer insertion, kernel factoring, logic decomposition can use static leakage as an additional cost function during optimization. For example, a buffer insertion algorithm may select buffer tree topologies that are optimal for area while meeting a given static leakage current constraint. AREA 620 lists the area of the logic macros before the leakage model and optimization algorithm were applied. Leak 630 lists the current leakage improvement of the logic macros after the leakage model and optimization algorithm were applied. Area 640 lists the area improvement of the logic macros after the leakage model and optimization algorithm were applied. Slack 650 lists the timing improvement of the logic macros after the leakage model and optimization algorithm were applied. Thus, for example, the logic macro "idcdsuc" had a reduced leakage of 4.94 μa, a reduced area of 0.79 μm and an increase in its timing of 1 ps.

Figure 7:
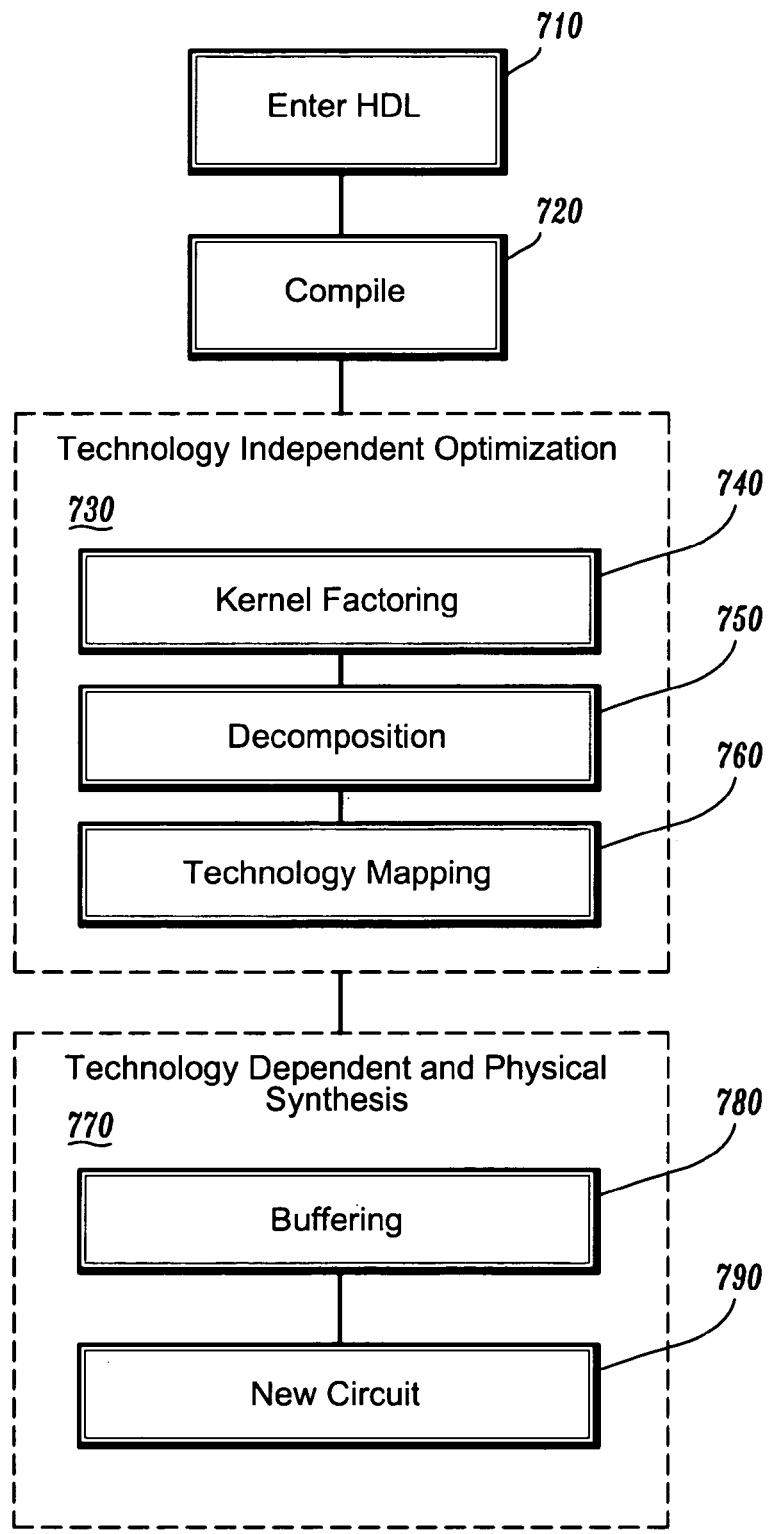
FIG. 7 illustrates an exemplary flowchart showing an operation of an electronic circuit design system in accordance with the present invention.

FIG. 7 illustrates an exemplary flowchart showing an operation of the electronic circuit design system in accordance with the present invention. As shown in FIG. 7, a user enters an HDL description of a circuit design via an input interface such as a keyboard or a remote device having wireless communication capabilities such as a personal digital assistant (PDA) (step 710). In step 710, the user may enter the leakage sensitivities (e.g., topology models) of the gates to be used in their design if they have not already been input to a library for use with an electronic design system. It is to be understood that a system administrator may update the library periodically with leakage sensitivities. After receiving the HDL description of the circuit design, the HDL is compiled (step 720) and stored in a memory.

Technology independent optimization is then performed on the compiled HDL (step 730) by accessing the memory and leakage sensitivities found in the library. During technology independent optimization, several optimizations may take place in order to optimize the circuit's area, timing and current leakage. It is to be understood that these optimizations may take place in any order and that some may not be performed. As shown in FIG. 7, a leakage driven kernel factoring is performed on the circuit (step 740). The leakage driven kernel factoring uses the static leakage power provided by the topology models in selecting the best factors for optimization and additionally performs a factoring such that maximum improvement in a number of literals is realized. The leakage driven kernel factoring in step 740 is followed by a leakage driven decomposition of the circuit (step 750) in which a technology drive decomposition algorithm selects boolean decomposition topologies based on static leakage provided by the topology model. Finally, a leakage driven technology mapping as described earlier (step 760) is applied. Each of these optimizations is applied to optimize the circuit so that it has a reduced leakage current at the end of the step. Although not shown in FIG. 7, each of these optimizations may be applied to optimize the circuit so that it has reduced area and faster time performance.

After technology independent optimization, a technology dependent optimization and physical synthesis takes place (step 770). During technology dependent optimization, in which the library and memory are accessed, additional optimizations take place, particularly leakage driven buffering (step 780). In step 780, for example, topologies of buffer or inverter trees are selected such that they are optimal for leakage while meeting delay or area constraints. This optimization may also be configured so that it reduces circuit area and timing. After leakage driven buffering a new circuit is generated that has a reduced current leakage and output to a user via an output interface such as a monitor (step 790).

It should be understood that the technology independent and technology dependent optimizations such as constant propagation, redundancy removal, global flow analysis, transduction, cube factoring, fan-out correction, fan-in reordering, inverter motion, etc. may be used by the present invention.

In an alternative exemplary embodiment the present invention may be used in combination with current circuit-level optimization techniques such as: (1) input vector control; (2) threshold variation; and (3) power supply gating in order to reduce current leakage.

It is to be understood that the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture.

It is to be further understood that, because some of the constituent system components and method steps depicted in the accompanying figures may be implemented in software, the actual connections between the system components (or the process steps) may differ depending on the manner in which the present invention is programmed. Given the teachings of the present invention provided herein, one of ordinary skill in the art will be able to contemplate these and similar implementations or configurations of the present invention.

It should also be understood that the above description is only representative of illustrative embodiments. For the convenience of the reader, the above description has focused on a representative sample of possible embodiments, a sample that is illustrative of the principles of the invention. The description has not attempted to exhaustively enumerate all possible variations. That alternative embodiments may not have been presented for a specific portion of the invention, or that further undescribed alternatives may be available for a portion, is not to be considered a disclaimer of those alternate embodiments. Other applications and embodiments can be straightforwardly implemented without departing from the spirit and scope of the present invention. It is therefore intended, that the invention not be limited to the specifically described embodiments, because numerous permutations and combinations of the above and implementations involving non-inventive substitutions for the above can be created, but the invention is to be defined in accordance with that claims that follow. It can be appreciated that many of those undescribed embodiments are within the literal scope of the following claims, and that others are equivalent.

What is claimed is:

1. A system for designing electronic circuits, comprising:
    a memory device for storing a program;
    a processor in communication with the memory device, the processor operative with the program to:
    receive an original circuit model, wherein the original circuit model has one or more logic gates, wherein each logic gate has a topology;
    calculate current leakage sensitivities for each of the topologies;
    provide the current leakage sensitivities to a library; and
    synthesize a new circuit model by factoring one or more kernels of the topologies of the original circuit model to determine one or more new topologies having reduced current leakage sensitivities and applying the one or more new topologies to the new circuit model wherein the new circuit model has a reduced current leakage with respect to the original circuit model.

2. The system of claim 1, wherein the processor is further operative with the program to:
    output the new circuit model.

3. The system of claim 1, wherein the current leakage sensitivities are determined by a topology dependent leakage analytical model.

4. The system of claim 1, wherein the current leakage sensitivities are determined by measuring the leakage current of the logic gate in a circuit simulator while applying various input patterns to the logic gate.

5. The system of claim 1, wherein the processor is further operative with the program when synthesizing to:
    optimize current leakage of the new circuit model.

6. The system of claim 1, wherein the processor is further operative with the program when synthesizing to:
    optimize timing of the new circuit model.

7. The system of claim 1, wherein the processor is further operative with the program when synthesizing to:
    optimize area of the new circuit model.

8. A method for designing electronic circuits, comprising:
    receiving an original circuit model, wherein the original circuit model has one or more logic gates, wherein each logic gate has a topology;
    calculating current leakage sensitivities for each of the topologies;
    providing the current leakage sensitivities to a library; and
    synthesizing a new circuit model by factoring one or more kernels of the topologies of the original circuit model to determine one or more new topologies having reduced current leakage sensitivities and applying the one or more new topologies to the new circuit model, wherein the new circuit model has a reduced current leakage with respect to the original circuit model.

9. The method of claim 8, further comprising:
outputting the new circuit model.

10. The method of claim 8, further comprising:
receiving a probability model indicating the probability of one or more of the logic gates in an input state.

11. The method of claim 8, further comprising:
receiving a probability model indicating the probability of one or more transistors being in an input state.

12. The method of claim 8, wherein the current leakage sensitivities are determined by a topology dependent leakage model.

13. The method of claim 8, wherein the synthesizing step further comprises:
adding one or more logic gates to the circuit model to create the new circuit model.

14. The method of claim 8, wherein the synthesizing step further comprises:
deleting one or more logic gates from the circuit model to create the new circuit model.

15. The method of claim 8, wherein the synthesizing step further comprises:
substituting one or more logic gates from the circuit model to create the new circuit model.

16. The method of claim 8, wherein the synthesizing step further comprises:
optimizing current leakage of the new circuit model.

17. The method of claim 8, wherein the synthesizing step further comprises:
optimizing timing of the new circuit model.

18. The method of claim 8, wherein the synthesizing step further comprises:
optimizing area of the new circuit model.

19. The method of claim 8, wherein the logic gates are selected from the group consisting of: and, or, nand, nor, xor, and inverter.

20. The method of claim 8, wherein the synthesizing step further comprises:
decomposing one or more portions of the original circuit model into one or more sub-circuits;
mapping one or more circuit gates in one or more of the sub-circuits to one or more of the logic gates in the library that are substituted for the respective circuit gate; and
modifying one or more of the sub-circuits with one or more buffers to create a buffer tree topology.

21. The method of claim 20, wherein the buffer tree topology comprises buffers having reduced transistor widths.

22. The method of claim 20, wherein the synthesizing step is performed on sub-circuits that do not have critical timing constraints.

23. The method of claim 20, wherein the synthesizing step is performed on sub-circuits that have critical timing constraints.

24. The method of claim 8, wherein the factoring step further comprises:
preventing the sharing of logic terms that create excess buffering; and
minimizing total physical area of the circuits on the chip.

25. The method of claim 20, wherein the mapping step further comprises:
analyzing a tradeoff between gate cloning and buffer insertion.

26. The method of claim 20, wherein the mapping step further comprises:
analyzing topologies comprising one or more transistor stacks.

27. The method of claim 20, wherein the mapping step further comprises:
analyzing a leakage tradeoff by considering the probability that one or more of the logic gates is in an input state.

28. The method of claim 20, wherein the mapping step further comprises:
analyzing a leakage tradeoff by considering the probability that a transistor is in an input state.

29. A computer program product comprising a computer useable medium having computer program logic recorded thereon for designing electronic circuits, the computer program logic comprising:
program code for receiving an original circuit model, wherein the original circuit model has one or more logic gates, wherein each logic gate has a topology;
program code for calculating current leakage sensitivities for each of the topologies;
program code for providing the current leakage sensitivities to a library; and
program code for synthesizing a new circuit model by factoring one or more kernels of the topologies of the original circuit model to determine one or more new topologies having reduced current leakage sensitivities and applying the one or more new topologies to the new circuit model, wherein the new circuit model has a reduced current leakage with respect to the original circuit model.

30. The computer program product of claim 29, further comprising:
program code for outputting the new circuit model.

31. The computer program product of claim 29, further comprising:
program code for optimizing current leakage of the new circuit model.

32. A system for topology selection to minimize leakage power during synthesis, comprising:
a memory device for storing a program;
a processor in communication with the memory device, the processor operative with the program to:
receive an original circuit design; and
synthesize a new circuit design having a minimized leakage power, wherein the power of the new circuit is minimized by applying current leakage, area or timing optimization algorithm that incorporates current leakage sensitivities of device topologies, wherein the current leakage optimization algorithm factors one or more kernels of the device topologies of the original circuit design to determine one or more new device topologies having reduced current leakage sensitivities and applies the one or more new device topologies to the new circuit design.

33. The system of claim 32, wherein the optimization algorithm is selected from the group consisting of: decomposition, technology mapping and buffering.

34. The system of claim 32, wherein the device topologies are selected from the group consisting of: and, or, nand, nor, xor, and inverter.

* * * * *